(12) United States Patent
Yano et al.

(10) Patent No.: US 12,417,930 B2
(45) Date of Patent: Sep. 16, 2025

(54) SUBSTRATE TREATING METHOD AND SUBSTRATE TREATING APPARATUS

(71) Applicant: SCREEN Holdings Co., Ltd., Kyoto (JP)

(72) Inventors: Wataru Yano, Kyoto (JP); Takayuki Nishida, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 18/423,205

(22) Filed: Jan. 25, 2024

(65) Prior Publication Data

US 2024/0258098 A1 Aug. 1, 2024

(30) Foreign Application Priority Data

Jan. 27, 2023 (JP) ................. 2023-011056

(51) Int. Cl.
*H01L 21/67* (2006.01)
*B08B 1/12* (2024.01)
(Continued)

(52) U.S. Cl.
CPC .......... *H01L 21/67046* (2013.01); *B08B 1/12* (2024.01); *B08B 1/36* (2024.01);
(Continued)

(58) Field of Classification Search
CPC ................. H01L 21/67046; H01L 21/02096
See application file for complete search history.

(56) References Cited

U.S. PATENT DOCUMENTS 5,943,726 A * 8/1999 Eitoku .............. H01L 21/67046
15/88.2
2002/0189641 A1 12/2002 Sato ................................. 136/6
(Continued)

FOREIGN PATENT DOCUMENTS

JP 2003-001199 A 1/2003
JP 2017-147334 A 8/2017

OTHER PUBLICATIONS

Office Action dated Oct. 3, 2024 issued in corresponding Japanese Patent Application No. 2023-011056.
(Continued)

*Primary Examiner* — Michael E Barr
*Assistant Examiner* — Richard Z. Zhang
(74) *Attorney, Agent, or Firm* — OSTROLENK FABER LLP

(57) ABSTRACT

Disclosed is a substrate treating method for performing cleaning treatment to a substrate by contacting a brush against the substrate. The method includes a rotating step of rotating a spin holder, holding the substrate, around a vertical shaft axis, an outer periphery edge contacting step of contacting the brush against the substrate at an outer periphery edge contacting position closer to an outer periphery edge of the substrate than to the shaft axis while the substrate is rotated in a horizontal plane, a first moving step of moving the brush from the outer periphery edge contacting position to a side adjacent to the shaft axis while the brush is brought into contact against the substrate, and a second moving step of moving the brush from the side adjacent to the shaft axis toward the outer periphery edge after the first moving step.

6 Claims, 9 Drawing Sheets

(51) Int. Cl.
    *B08B 1/36*         (2024.01)
    *H01L 21/02*       (2006.01)

(52) U.S. Cl.
    CPC .. *H01L 21/02076* (2013.01); *H01L 21/02096* (2013.01); *H01L 21/67092* (2013.01)

(56) References Cited

U.S. PATENT DOCUMENTS

| | | | |
|---|---|---|---|
| 2003/0070242 A1 | 4/2003 | Tseng et al. | |
| 2014/0311532 A1* | 10/2014 | Yokoyama | H01L 21/68728 134/33 |
| 2016/0254170 A1* | 9/2016 | Hu | B08B 3/102 134/1.3 |
| 2018/0289230 A1* | 10/2018 | Imamura | B08B 11/02 |

OTHER PUBLICATIONS

Extended European Search Report dated Sep. 16, 2024 for the corresponding European Patent Application No. 23216118.2.

* cited by examiner

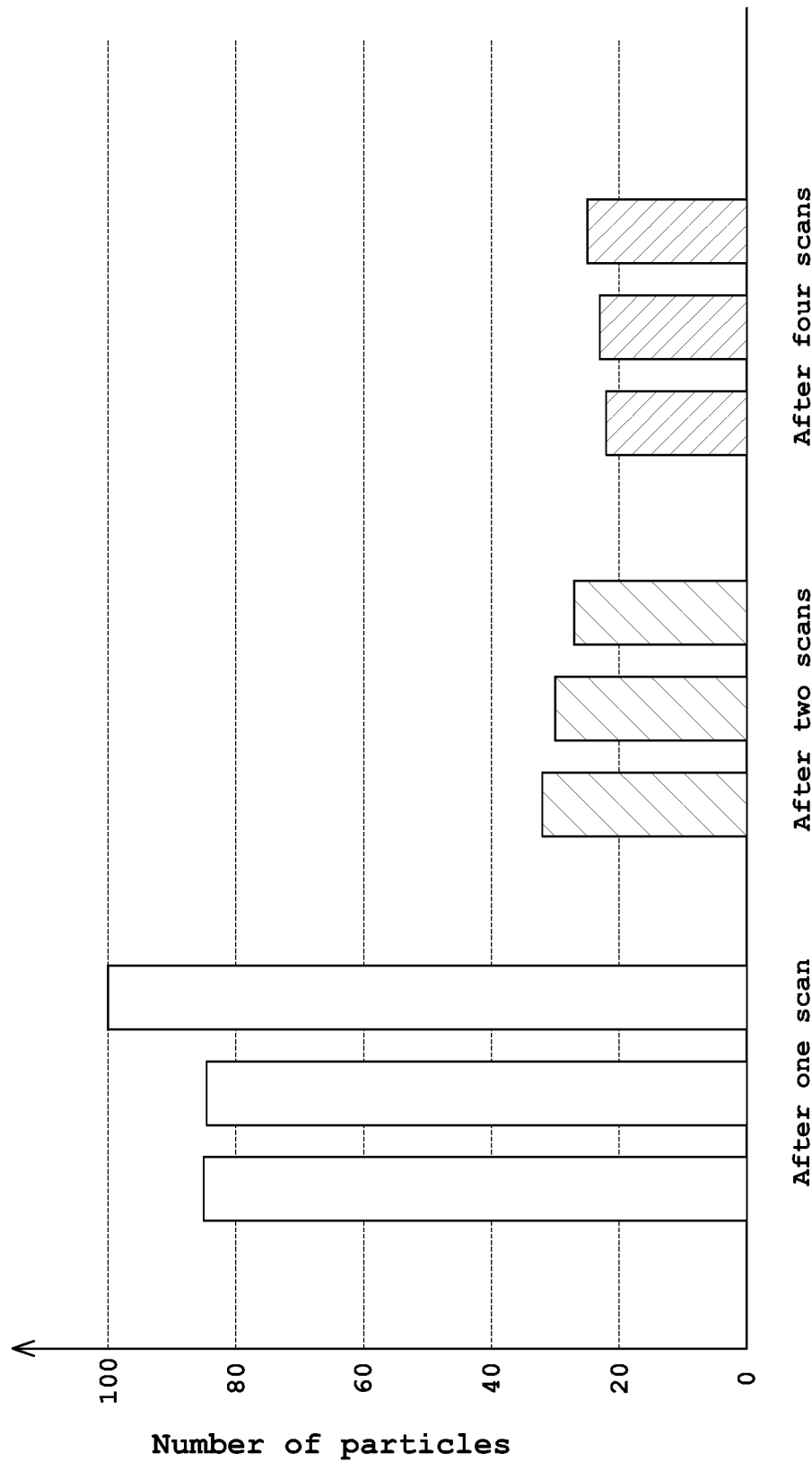

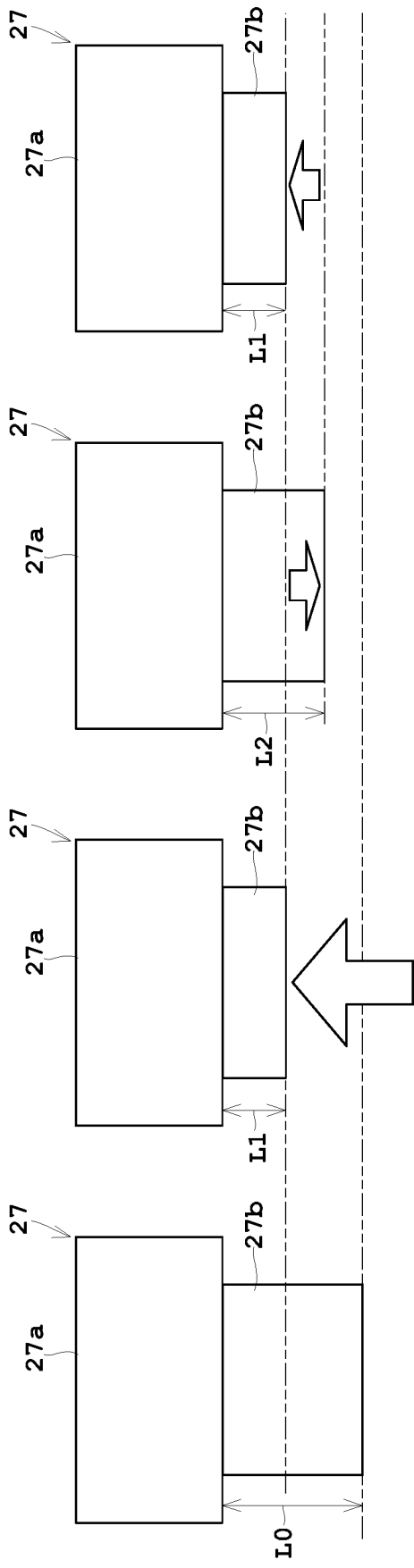

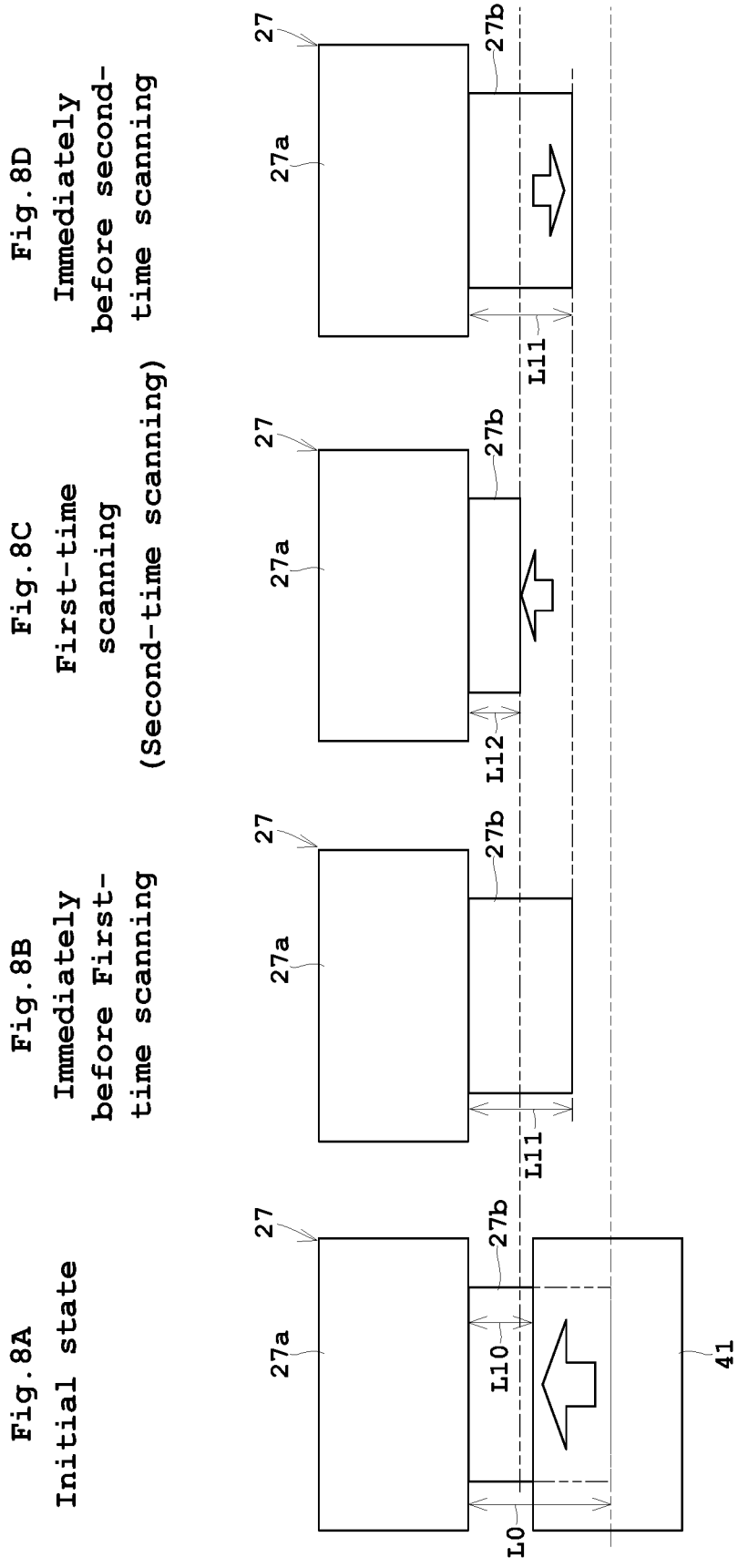

SUBSTRATE TREATING METHOD AND SUBSTRATE TREATING APPARATUS

BACKGROUND OF THE INVENTION

Field of the Invention

The present invention relates to a substrate treating method and a substrate treating apparatus for performing cleaning treatment on a substrate, such as a semiconductor substrate, a substrate for flat panel display (FPD) like liquid crystal display and organic electroluminescence (EL) display, a glass substrate for photomask, and an optical disk substrate, by contacting a brush against the substrate.

Description of the Related Art

Examples of currently-used apparatus of this type includes one including a chuck, a brush, and an arm. See, for example, Japanese Unexamined Patent Publication No. 2017-147334A. The chuck contacts and supports an outer periphery edge of a substrate. The chuck holds the substrate while a back face of the substrate is directed upward. The chuck rotates around a vertical axis while holding the substrate. The brush is attached to a distal end of the arm. The brush is rotated around the vertical axis.

The arm causes the brush to contact against the rotational center of the substrate, to a surface of which a cleaning liquid is supplied, and to move toward the outer periphery edge of the substrate. Thereafter, the arm causes the brush to move upward to the rotational center of the substrate again, and then to contact the brush against the rotational center of the substrate and to move toward the outer periphery edge. Such scanning is repeated a predetermined number of times. Accordingly, a cleaning treatment is performed to the entire back face of the substrate with the brush. Here, moving the brush from the center to the outer periphery edge of the substrate also means sweeping dust on the substrate toward an outer periphery edge of the substrate by moving the brush.

However, the example of the currently-used apparatus with such a construction has the following drawback. Specifically, in the currently-used apparatus, dust adhered to the back face of the substrate is caught by or attached to the brush, whereby the back face of the substrate is cleaned. The dust caught by or attached to the brush is removed to some extent by cleaning the brush in a standby pot, but cannot be removed completely. Accordingly, even with the brush cleaned in the standby pot, other substrates may not be cleaned with the brush.

In addition, the brush is deformed due to pressing when contacting against the substrate. Consequently, the brush is deformed when contacting against the rotational center of the substrate, and at that time dust remaining in the brush is released. A peripheral velocity is extremely slower at the rotational center than at the outer periphery of the substrate. Accordingly, the dust released from the brush is hard to be discharged together with a treatment liquid from the outer periphery edge of the substrate. This results in possibility of a contaminated back face of the substrate with the brush.

SUMMARY OF THE INVENTION

The present invention has been made regarding the state of the art noted above, and its one object is to provide a substrate treating method and a substrate treating apparatus that can prevent contamination of a substrate caused by deformation of a brush.

The present invention is constituted as stated below to achieve the above object.

One aspect of the present invention provides a substrate treating method for performing cleaning treatment to a substrate by contacting a brush against the substrate. The method includes: a rotating step of rotating a spin holder, holding the substrate, around a vertical shaft axis in a vertical direction; an outer periphery edge contacting step of contacting the brush against the substrate at an outer periphery edge contacting position closer to an outer periphery edge of the substrate than to the shaft axis while the substrate is rotated in a horizontal plane; a first moving step of moving the brush from the outer periphery edge contacting position to a side adjacent to the shaft axis while the brush is brought into contact against the substrate; and a second moving step of moving the brush from the side adjacent to the shaft axis toward the outer periphery edge after the first moving step.

With the aspect of the present invention, the substrate is rotated around the vertical shaft axis in the rotating step, and the brush is brought into contact against the rotating substrate at the outer periphery edge contacting position in the outer periphery edge contacting step. At this time, the brush is brought into contact at a position closer to the outer periphery edge than to the shaft axis. Accordingly, the brush is brought into contact at a position on the substrate at which a peripheral velocity is higher than that at the shaft axis. Here, the brush is deformed and dust is released. The dust is discharged toward an outer periphery of the substrate due to the high peripheral velocity, suppressing contamination of the substrate with the dust. Thereafter, the brush is moved from the outer periphery edge contacting position to a side adjacent to the shaft axis in the first moving step, and the brush is moved from the side adjacent to the shaft axis toward the outer periphery edge in the second moving step. Consequently, the substrate can be cleaned with a clean brush from which the dust is released. This results in prevention of contamination of the substrate caused by the deformation of the brush.

Moreover, it is preferred in the aspect of the present invention that the first moving step and the second moving step are performed a plurality of times.

Moving the brush on the substrate a plurality of times achieves cleaning of the substrate at a high degree of cleanness.

Moreover, it is preferred in the aspect of the present invention that the outer periphery edge contacting position is located at the outer periphery edge of the substrate.

The peripheral velocity is the highest at the outer periphery edge of the substrate. Accordingly, the dust released from the brush can be discharged to the surroundings efficiently.

Another aspect of the present invention provides a substrate treating apparatus that performs cleaning treatment to a substrate while contacting a brush to the substrate. The apparatus includes: a spin holder configured to hold the substrate rotatably around a vertical shaft axis; a brush configured to contact against the substrate, rotated by the spin holder, to clean the substrate; a brush holder configured to hold the brush; a horizontal drive unit configured to move the brush holder in a horizontal direction; a lifting drive unit configured to move the brush holder in a vertical direction; and a controller configured to operate the horizontal drive unit and the lifting drive unit to perform a first action, a second action, and a third action in this order. In the first action, the brush is brought into contact against the substrate, rotated by the spin holder, at an outer periphery edge contacting position closer to an outer periphery edge of the substrate than to the shaft axis. In the second action, the brush is moved from the outer periphery edge contacting position to a side adjacent to the shaft axis while the brush is brought into contact against the substrate. In the third action, the brush is moved from the side adjacent to the shaft axis toward the outer periphery edge of the substrate while the brush is brought into contact against the substrate.

With the aspect of the present invention, the controller causes the brush to contact against the substrate at the outer periphery edge contacting position closer to the outer periphery edge of the substrate through the first action. Accordingly, the brush is brought into contact at a position on the substrate at which a peripheral velocity is higher than that at the shaft axis. Here, the brush is deformed and dust is released. The dust is discharged toward an outer periphery of the substrate due to the peripheral velocity, suppressing contamination of the substrate with the dust. The controller causes the brush to move from the outer periphery edge contacting position to the side adjacent to the shaft axis through the second action. The controller causes the brush to move from the side adjacent to the shaft axis toward the outer periphery edge of the substrate through the third action. Consequently, the substrate can be cleaned with a clean brush from which the dust is released. This results in prevention of contamination of the substrate caused by the deformation of the brush.

Another aspect of the present invention provides a substrate treating method for performing cleaning treatment to a substrate by contacting a brush against the substrate. The method includes: a rotating step of rotating a spin holder, holding the substrate, around a vertical shaft axis; a deforming step of deforming the brush by pressing a cleaning face of the brush against a pressed member before the brush contacts a cleaning start position of the substrate; a deformed brush contacting step of contacting the brush at the cleaning start position of the substrate until the brush returns to its original shape while the substrate is rotated in a horizontal plane; and a cleaning step of cleaning the substrate by moving the brush over the substrate, wherein the steps are performed in this order.

With the aspect of the present invention, the substrate is rotated around the vertical shaft axis in the rotating step, and the brush is deformed in the deforming step. Accordingly, the brush is deformed and dust is released. Thereafter, the brush is brought into contact at the cleaning start position of the rotating substrate until the deformed brush returns to its original shape in the deformed brush contacting step. Accordingly, the brush is deformed slightly when the brush is brought into contact at the cleaning start position. Consequently, even if there is dust that is not released from the brush in the deforming step, dust released from the brush is suppressed in the deformed brush contacting step. Thereafter, the substrate is cleaned by moving the brush over the substrate in the cleaning step. This results in prevention of contamination of the substrate caused by the deformation of the brush.

Moreover, it is preferred in the deforming step of the present invention that the brush presses against the pressed member at a pressure higher than treatment pressure when the brush presses against the substrate in the cleaning step.

Since the brush presses against the pressed member at the pressure higher than the treatment pressure when the cleaning step is performed, an amount of deformation of the brush can be equal to an amount of deformation of the brush when the substrate is treated. Accordingly, dust released in the deformed brush contacting step can be released before the brush is brought into contact against the substrate to apply pressure to the substrate. Moreover, the brush presses against the pressed member at pressure higher than the treatment pressure when the cleaning step is performed, achieving large deformation of the brush. Consequently, time until the brush returns to its original shape can be made long. Therefore, it is possible to certainly make the deformed brush not to return to its original shape at the time when the brush is brought into contact against the substrate in the deformed brush contacting step. This results in certain suppression of release of dust from the brush in the deformed brush contacting step.

Another aspect of the present invention provides a substrate treating apparatus that performs cleaning treatment to a substrate by contacting a brush to the substrate. The apparatus includes: a spin holder configured to hold the substrate rotatably around a vertical shaft axis; a brush configured to contact against the substrate, rotated by the spin holder, to clean the substrate; a standby pot provided more outward than an outer periphery edge of the substrate held by the spin holder and configured to make the brush in a standby state; a pressed member against which a cleaning face of the brush is pressed; a brush holder configured to hold the brush; a horizontal drive unit configured to move the brush holder in a horizontal direction; a lifting drive unit configured to move the brush holder in a vertical direction; and a controller configured to operate the horizontal drive unit and the lifting drive unit such that the brush cleans the substrate by moving the brush to a cleaning start position of the substrate after the brush is deformed by pressing the cleaning face of the brush against the pressed member before the brush contacts a cleaning start position of the substrate and until the brush returns to its original shape.

With the aspect of the present invention, the controller causes the brush to be deformed by pressing the cleaning face of the brush against the pressed member before the brush contacts the cleaning start position of the substrate. Then, the controller operates the horizontal drive unit and the lifting drive unit such that the brush cleans the substrate by moving the brush to the cleaning start position of the substrate until the brush returns to its original shape. Consequently, an amount of deformation of the brush at contact is reduced. Therefore, even if there is dust that is not released from the brush by pressing of the brush against the pressed member, dust released from the brush is suppressed at the cleaning start position. Thereafter, the substrate is cleaned by moving the brush over the substrate. This results in prevention of contamination of the substrate caused by the deformation of the brush.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 2 illustrates a graph comparing degrees of cleanness after cleaning treatment is performed in a conventional example.

FIG. 3A illustrates an initial state in which a brush is deformed in the conventional example, FIG. 3B illustrates a condition at first-time scanning, FIG. 3C illustrates a condition immediately before second-time scanning, and FIG. 3D illustrates a condition at second-time scanning.

FIG. 8A illustrates an initial state in which a brush is deformed in the second embodiment, FIG. 8B illustrates a condition immediately before first-time scanning, FIG. 8C illustrates a condition at the first-time scanning (second-time scanning), and FIG. 8D illustrates a condition immediately before second-time scanning.

DESCRIPTION OF THE PREFERRED EMBODIMENTS

Embodiments of the present invention will be described with reference to the following embodiments.

First Embodiment

Figure 1:
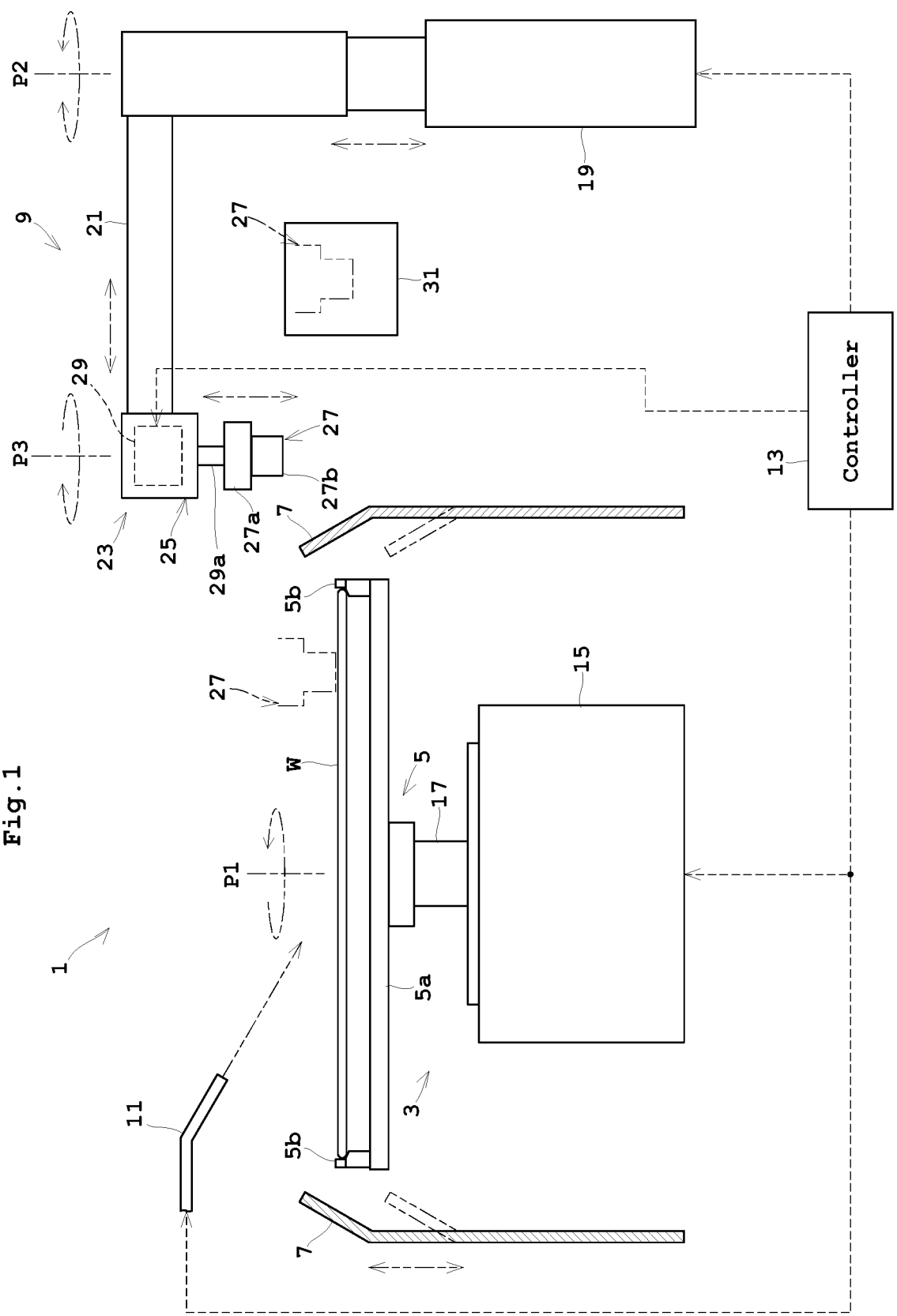
FIG. 1 illustrates an overall configuration of a substrate treating apparatus according to a first embodiment of the present invention.

The following describes a first embodiment of the present invention with reference to the drawings. FIG. 1 illustrates an overall configuration of a substrate treating apparatus according to the first embodiment of the present invention.

A substrate treating apparatus 1 treats substrates W. The substrate treating apparatus 1 is so-called a single-wafer processing apparatus for treating substrates one by one. The substrate W has a circular shape in plan view, for example. The substrate treating apparatus 1 performs treatment on a back face of a substrate W directed upward, for example. Examples of the treatment include cleaning treatment for removing dirt, such as particles, adhered on the substrate W.

<1. Overall Configuration>

The substrate treating apparatus 1 includes a base unit 3, a chuck unit 5, a guard 7, a brush cleaning unit 9, a nozzle 11, and a controller 13.

<2. Base Unit>

The base unit 3 includes the chuck unit 5. The base unit 3 rotates the chuck unit 5. The chuck unit 5 rotates the substrate W in a horizontal plane while holding the substrate W in a horizontal posture.

The base unit 3 includes an electric motor 15. The electric motor 15 includes a rotary shaft 17. The rotary shaft 17 extends and protrudes in a vertical direction. The rotary shaft 17 rotates around a vertical shaft axis P1 by the electric motor 15. The chuck unit 5 is attached to an upper end of the rotary shaft 17.

<3. Chuck Unit>

The chuck unit 5 has a circular shape in plan view. The chuck unit 5 includes a plate 5a, and a plurality of support pins 5b. The plate 5a has a diameter slightly larger than a diameter of the substrate W. The support pins 5b are erected on an outer peripheral portion of an upper face of the plate 5a. The support pins 5b contact and support an outer periphery edge of the substrate W while the back face of the substrate W is spaced apart from the upper face of the plate 5a.

Here, the chuck unit 5 described above corresponds to the "spin holder" in the present invention.

<4. Guard>

The guard 7 is located laterally of the electric motor 15. The guard 7 surrounds the electric motor 15 laterally. The guard 7 prevents scattering of a treatment liquid, supplied from the nozzle 11 to the substrate W, to the surroundings when the brush cleaning unit 9 performs cleaning treatment. The guard 7 moves upward and downward between a treatment level, denoted by solid lines in FIG. 1, and a delivery level, denoted by chain double-dashed lines in FIG. 1. The delivery level is positioned below the treatment level. The guard 7 guides the treatment liquid, scattered from the outer periphery edge of the substrate W to the surroundings, downward at the treatment level.

<5. Brush Cleaning Unit>

The brush cleaning unit 9 includes a rotating and lifting mechanism 19, arm 21, and a brush head 23. The rotating and lifting mechanism 19 drives to move the arm 21 upward and downward in the vertical direction. The rotating and lifting mechanism 19 drives to rotate the arm 21 around a vertical shaft axis P2. The rotating and lifting mechanism 19 includes, for example, a rotating mechanism provided with a rotary shaft in the vertical direction and formed by an electric motor, and a lifting mechanism for moving the electric motor upward and downward in the vertical direction. The arm 21 has a proximal end connected to the rotating and lifting mechanism 19. The arm 21 has a distal end attached to the brush head 23. The brush head 23 is driven by the rotating and lifting mechanism 19 so as to swing in the horizontal plane.

Here, instead of the rotating and lifting mechanism 19, a linear moving and lifting mechanism can be adopted that linearly moves the proximal end and the distal end of the arm 21 simultaneously in the horizontal direction via ball screws and the like that are arranged in the horizontal direction.

The brush head 23 includes a head body 25 and a brush 27. The head body 25 is attached to the distal end of the arm 21. The head body 25 has an electric motor 29 embedded therein. The electric motor 29 includes a rotary shaft 29a. The rotary shaft 29a extends and protrudes in the vertical direction. The electric motor 29 drives to rotate the rotary shaft 29a around a vertical shaft axis P3. The electric motor 29 rotates the brush 27 around the shaft axis P3. The brush 27 is located on a lower part of the head body 25. The brush 27 is attached to a lower end of the rotary shaft 29. The brush 27 is rotated around the shaft axis P3 by the electric motor 29. The brush 27 can be attached to and detached from the rotary shaft 29a freely.

The brush 27 includes a bracket 27a and a brush body 27b. The brush 27 is attached to and detached from the rotary shaft 29a freely through the bracket 27a. The brush body 27b is, for example, made of synthetic resin. Specifically, the brush body 27b is composed of polyvinyl alcohol (PVA). PVA has high hydrophilicity, and fine pores running vertically and horizontally. Accordingly, the brush body 27b produces a capillary phenomenon, exerting high water absorption and water retention. Moreover, the brush body 27b takes and holds water certainly together with dust. In addition, PVA has flexibility and elasticity. Accordingly, the brush body 27b does not damage the substrate W to be cleaned.

The rotating and lifting mechanism 19 moves the brush 27 between a contacting position and a separate position. The contacting position is a position where the brush 27 works on an upper surface of the substrate W. The contacting position includes a height position where a lower face of the brush body 27b directly contacts the upper surface of the substrate W and a height position where the lower face of the brush body 27b indirectly works on the upper surface of the substrate W via the treatment liquid. The separate position is a position where the brush 27 is spaced apart from the outer periphery edge of the substrate W. The separate position is a position where the brush 27 does not work on the substrate W.

Here, the brush head 23 described above corresponds to the "brush holder" in the present invention. The rotating and lifting mechanism 19 described above corresponds to the "horizontal drive unit" and the "lifting drive unit" in the present invention.

The brush head 23 moves the brush body 27b downward from such a state where the lower face of the brush body 27b contacts the upper surface of the substrate W. At this time, a pressing force of the brush body 27b pressing against the substrate W is determined from pressure detected by the brush head 23 or an amount of pressing. This pressing force corresponds to treatment pressure when cleaning treatment is performed on the substrate W.

A standby pot 31 is located laterally of the base unit 3. The standby pot 31 is located laterally of the guard 7. The standby pot 31 is located laterally of the rotating and lifting mechanism 19. The standby pot 31 brings the brush 27 in a standby state. The standby pot 31 can house the brush 27 inside thereof. The standby pot 31 can remove dirt, such as particles, adhered to the brush 27. The standby pot 31 has a function of cleaning the brush 27 by spraying the cleaning liquid to the brush 27 to make the brush 27 cleaned. The position of the standby pot 31 is the separate position described above.

The nozzle 11 supplies the treatment liquid to the upper surface of the substrate W while the substrate W is rotated around the shaft axis P1. The nozzle 11 supplies the treatment liquid to the substrate W over an upper edge of the guard 7. The nozzle 11 in this embodiment is immovable. That is, a position of the nozzle 11 in this embodiment is fixed. However, only during treatment, the nozzle 11 may be movable to a position shown in FIG. 1. Examples of the treatment liquid supplied from the nozzle 11 include deionized water, and a chemical liquid. The chemical liquid contains at least one selected from sulfuric acid, nitric acid, acetic acid, hydrochloric acid, hydrofluoric acid, ammonia water, and hydrogen peroxide solution, for example. More specifically, SC-1 as a mixed liquid of ammonia water and hydrogen peroxide solution may be used as the chemical liquid, for example.

<6. Controller>

The controller 13 controls en bloc each element of the apparatus mentioned above. The controller 13 includes a CPU and a memory.

The controller 13 controls operation of moving the guard 7 upward and downward, operation of supplying the treatment liquid from the nozzle 11, operation of rotating the electric motor 15, operation of rotating and lifting the rotating and lifting mechanism 19, operation of rotating the electric motor 29, and operation of pushing of the brush 27 by the brush head 23.

The controller 13 mainly controls the rotating and lifting mechanism 19 to perform a first action, a second action, and a third action as under. The controller 13 performs the first action, the second action, and the third action in this order.

<First Action>

The controller 13 operates the electric motor 15 to rotate the substrate W at a predetermined speed of treatment. The controller 13 operates the nozzle 11 to supply the treatment liquid around the shaft axis P1 on the upper surface of the substrate W. The controller 13 causes the brush 27 to contact against the substrate W at the outer periphery edge contacting position closer to the outer periphery edge of the substrate W than to the shaft axis P1 while rotating the brush 27. The outer periphery edge contacting position is preferably the outer periphery edge at an outermost periphery of the substrate W. Here, the outer periphery edge is the outermost position in a radial direction of the substrate W at which all the cleaning face of the brush body 27b contacts the substrate W when the brush body 27b of the brush 27 contacts against the substrate W.

<Second Action>

The controller 13 operates the rotating and lifting mechanism 19 to move the brush 27 from the outer periphery edge contacting position toward the shaft axis P1 while the brush 27 contacts against the upper surface of the substrate W. Specifically, the brush 27 is moved horizontally to a position where the shaft axis P1 conforms to the shaft axis P3 in plan view.

<Third Action>

The controller 13 moves the brush 27 from a side adjacent to the shaft axis P1 to the contacting position described above while the brush 27 contacts against the upper surface of the substrate W.

<7. Mechanism of Lowering Degree of Cleanness>

Reference is now made to FIGS. 2 and 3. FIG. 2 illustrates a graph comparing degrees of cleanness after cleaning treatment is performed in a conventional example. FIG. 3 is an explanatory view of deformation of the brush in the conventional example. Here in FIG. 3, FIG. 3A illustrates an initial state, FIG. 3B illustrates a condition at first-time scanning, FIG. 3C illustrates a condition immediately before second-time scanning, and FIG. 3D illustrates a condition at second-time scanning. Note that FIG. 2 shows data obtained from three samples each after a scan.

In the conventional example, the rotating and lifting mechanism 19 operates to rotate the brush 27 as under. That is, the controller 13 operates to contact the brush 27 against the upper surface of the substrate W on the shaft axis P1, and to move the brush 27 horizontally toward the outer periphery edge of the substrate W while pressing the brush 27 against the substrate W at treatment pressure. Here, action from the shaft axis P1 to the outer periphery edge is referred to as one scan. The controller 13 causes the brush 27 to move upward from the upper surface of the substrate W for performing the next scan. At this time, a degree of cleanness of the substrate W is determined after one scan, two scans, and four scans. Then, it is revealed that a degree of cleanness after the one scan is lowest, and it becomes higher after the two scans and the four scans in this order.

Such a result is considered to be obtained from the following. Specifically, a length of the brush body 27b in the vertical direction is L0 at an initial state before the brush 27 contacts against the substrate W as shown in FIG. 3A. The length of the brush body 27b in the vertical direction is L1 at a state (first-time scanning) where the brush 27 contacts against the substrate W on the shaft axis P1 at treatment pressure as shown in FIG. 3B. The length L1 is smaller than the length L0. Next, the length of the brush body 27b in the vertical direction is L2 at a state (immediately before second-time scanning) after the brush 27 moves to the outer periphery edge of the substrate W and moves upward and immediately before the brush 27 contacts against the substrate W again on the shaft axis P1 at treatment pressure as shown in FIG. 3C. The length L2 is smaller than the length L0 and larger than the length L1. The length of the brush body 27b in the vertical direction is L1 at a state (second-time scanning) where the brush 27 is pressed on the shaft axis P1 at treatment pressure as shown in FIG. 3D.

As described above, the brush body 27b expands and contracts in such a manner that the length thereof in the vertical direction varies to L0, L1, L2, and L1. When the length varies from L0 to L1, the length of the brush body 27b in the vertical direction decreases most largely. The brush body 27b catches dust or has the dust attached thereto when the substrate W already treated is cleaned. Accordingly, when the brush body 27b largely contracts, a predetermined amount of dust is released outside from the brush body 27b. The release dust is discharged outward of the substrate W together with the treatment liquid due to a centrifugal force of the substrate W. Here, since the shaft axis P1 is the rotational center, a peripheral velocity is low. Accordingly, the dust is hard to be discharged from the outer periphery edge of the substrate W to the surroundings. With such a phenomenon, a degree of cleanness after the first-time scanning is low.

Figure 4A:
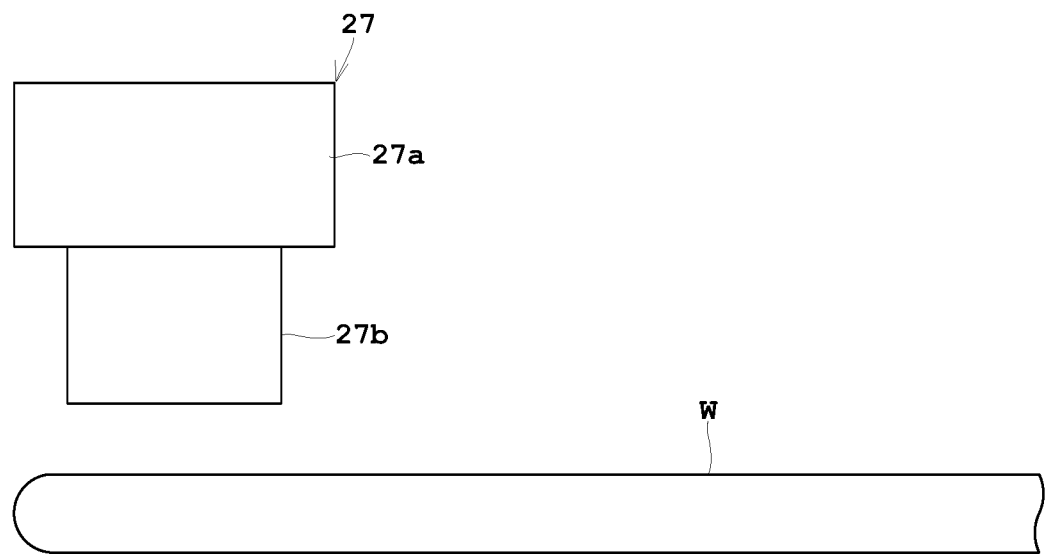
FIG. 4A illustrates an initial state in which a brush is deformed in the first embodiment.
Figure 4B:
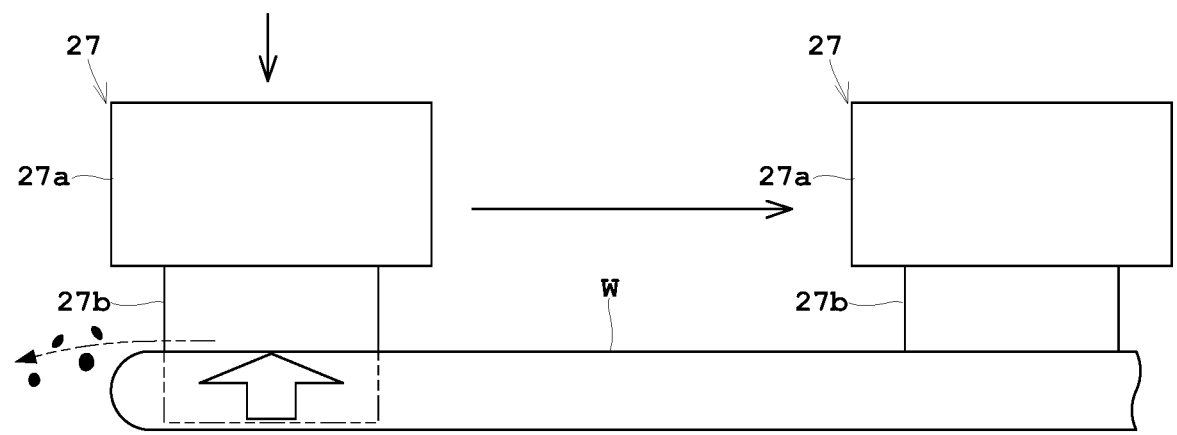
FIG. 4B illustrates a condition at first-time scanning.

Reference is now made to FIG. 4. FIG. 4 is an explanatory view of deformation of the brush in the first embodiment. FIG. 4A illustrates an initial state, and FIG. 4B illustrates a condition at first-time scanning.

In order to address the phenomenon described above, the controller 13 performs the first action, the second action, and the third action described above in this order. That is, as shown in FIG. 4A, the brush 27 is located adjacent to the outer periphery edge of the substrate W. Preferably, the brush 27 is located at the outer periphery edge of the substrate W. When the brush 27 contacts as shown in FIG. 4B, the brush body 27b contracts most largely to release a predetermined amount of dust. Here, a peripheral velocity is extremely higher at the side of the outer periphery edge than that at the side adjacent to the shaft axis P1. Accordingly, the dust released from the brush body 27b is discharged together with the treatment liquid from the outer periphery edge of the substrate W to the surroundings. Then, the brush 27 is moved toward the shaft axis P1, and then is moved from the side adjacent to the shaft axis P1 to the outer periphery edge of the substrate W. Movement of the brush 27 is controlled in such a manner as above, resulting in prevention of contamination of the substrate W caused by the deformation of the brush 27.

<8. Cleaning Treatment>

The following describes the cleaning treatment with reference to FIG. 5. FIGS. 5A to 5D are each an explanatory view of cleaning treatment in the first embodiment. Here in the cleaning treatment, the nozzle 11 supplies the treatment liquid, which illustration is omitted.

Figure 5A:
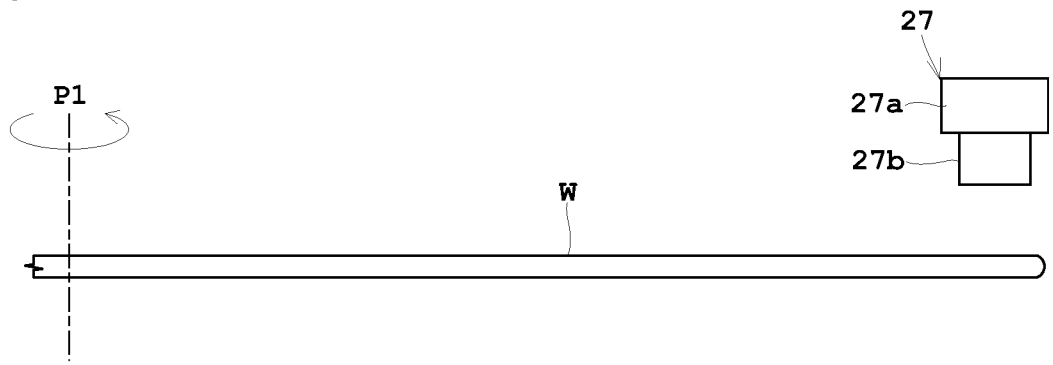
FIGS. 5A to 5D are each an explanatory view of cleaning treatment in the first embodiment.

The controller 13 causes the substrate W to rotate at a number of treatment rotations. This step corresponds to the "rotating step" in the present invention. When a number of rotations reaches the number of treatment rotations, the controller 13 operates the rotating and lifting mechanism 19 to move the brush 27 to the outer periphery edge of the substrate W (FIG. 5A).

Figure 5B:
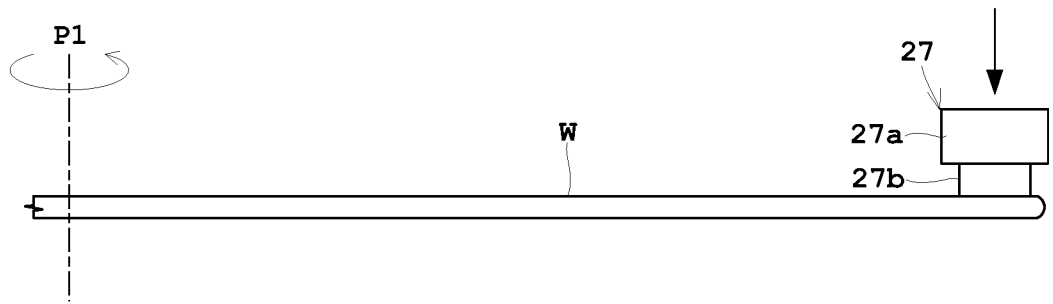

The controller 13 operates the rotating and lifting mechanism 19 to contact the brush 27 against the outer periphery edge of the substrate W. This step corresponds to the "outer periphery edge contacting step" in the present invention. Moreover, the outer periphery edge corresponds to the "outer periphery edge contacting position" in the present invention. Moreover, the controller 13 operates the brush head 23 to apply treatment pressure to the brush 27 (FIG. 5B). At this time, the brush body 27b contracts largely in the vertical direction. Naturally, a given amount of dust is released from the brush body 27b at this time, the dust is discharged from the outer periphery edge of the substrate W to the surroundings at a rapid peripheral velocity at the outer periphery edge. Accordingly, the substrate W is hard to be contaminated by the dust released from the brush 27.

Figure 5C:
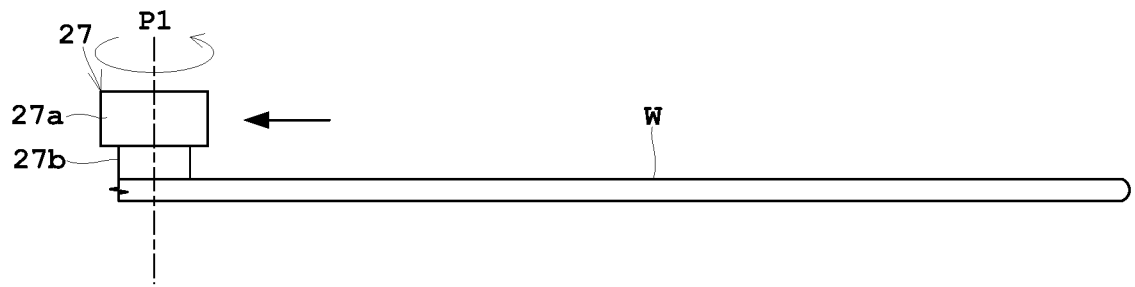

The controller 13 moves the brush 27 from the outer periphery edge of the substrate W toward the shaft axis P1 as the rotational center of the substrate W (FIG. 5C). This corresponds to first-time scanning. Here, this step corresponds to the "first moving step" in the present invention.

Figure 5D:
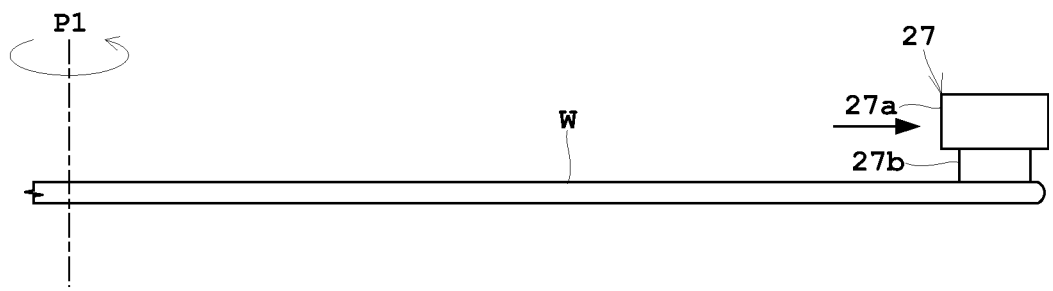

The controller 13 moves the brush 27 from a side adjacent to the shaft axis P1 toward the outer periphery edge of the substrate W (FIG. 5D). This corresponds to second-time scanning. Here, this step corresponds to the "second moving step" in the present invention.

The controller 13 performs cleaning treatment by scanning repeatedly at a plurality of times as necessary. Moving the brush 27 in the horizontal direction at a plurality of times achieves cleaning of the substrate W at a high degree of cleanness.

With this embodiment, the controller 13 causes the brush 27 to contact at the outer periphery edge contacting position on the outer periphery edge of the substrate W through the first action. Accordingly, the brush 27 contacts against the substrate W at a position having a higher peripheral velocity than that of the shaft axis P1. Here, the brush body 27b is deformed to release dust. The dust is discharged toward an outer periphery of the substrate W due to the high peripheral velocity, suppressing contamination of the substrate W with the dust. The controller 13 causes the brush 27 to move from the outer periphery edge contacting position toward a side adjacent to the shaft axis P1 through the second action. The controller 13 causes the brush 27 to move from the side adjacent to the shaft axis P1 toward the outer periphery edge of the substrate W through the third action. Consequently, the substrate W can be cleaned with the clean brush 27 from which the dust is released. This results in prevention of contamination of the substrate W caused by the deformation of the brush 27.

Figure 6:
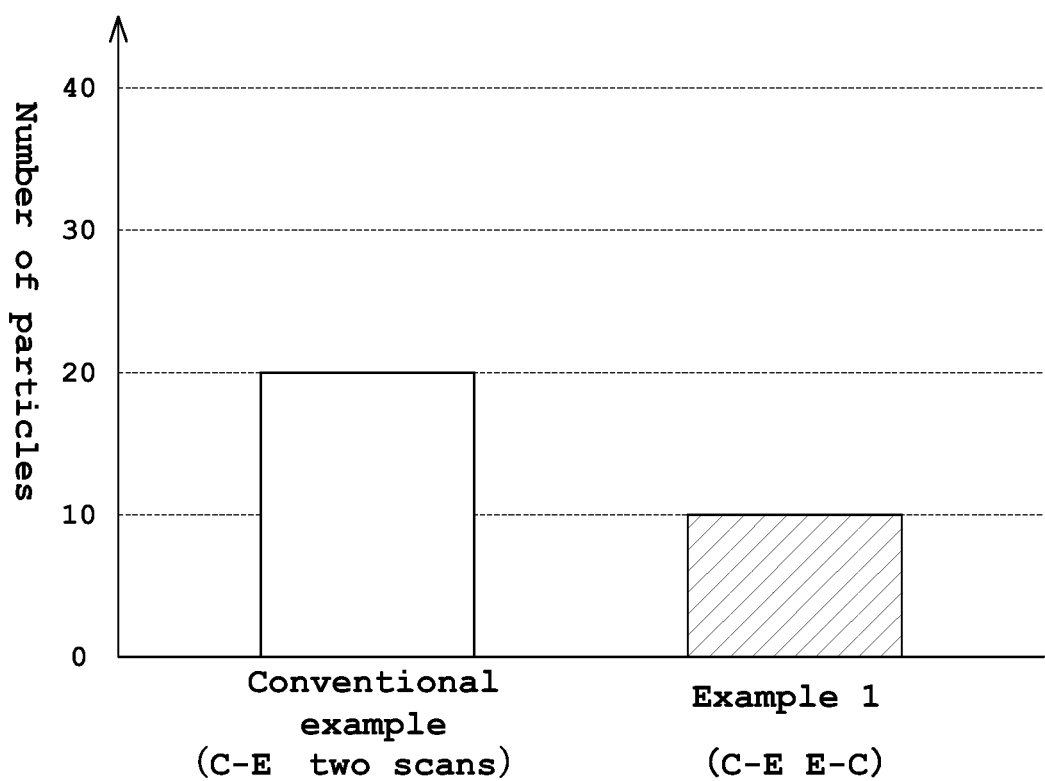
FIG. 6 illustrates a graph comparing degrees of cleanness between the first embodiment and the conventional example.

Then, comparison is made of degrees of cleanness due to cleaning treatment between the first embodiment and the conventional example as described above. FIG. 6 illustrates a graph comparing degrees of cleanness between the first embodiment and the conventional example. Here in FIG. 6, an action of moving the brush 27 from the shaft axis P1 toward the outer periphery edge of the substrate W is denoted by a term C-E, and an action of moving the brush 27 from the outer periphery edge toward the shaft axis P1 of the substrate W is denoted by a term E-C.

The conventional example shows a degree of cleanness after cleaning treatment where a scan from the shaft axis P1 to the outer periphery edge is made two times. The first embodiment shows a degree of cleanness after cleaning treatment of two scans made by a scan from the outer periphery edge to the shaft axis P1 and a scan from the shaft axis P1 to the outer periphery edge.

It is revealed from this graph that the degree of cleanness can be made higher in the first embodiment than that in the conventional example. This can enhance a yield of a device produced by the substrate W. As a result, a less device to be disposed can be achieved, leading to less environmental load.

Second Embodiment

Figure 7:
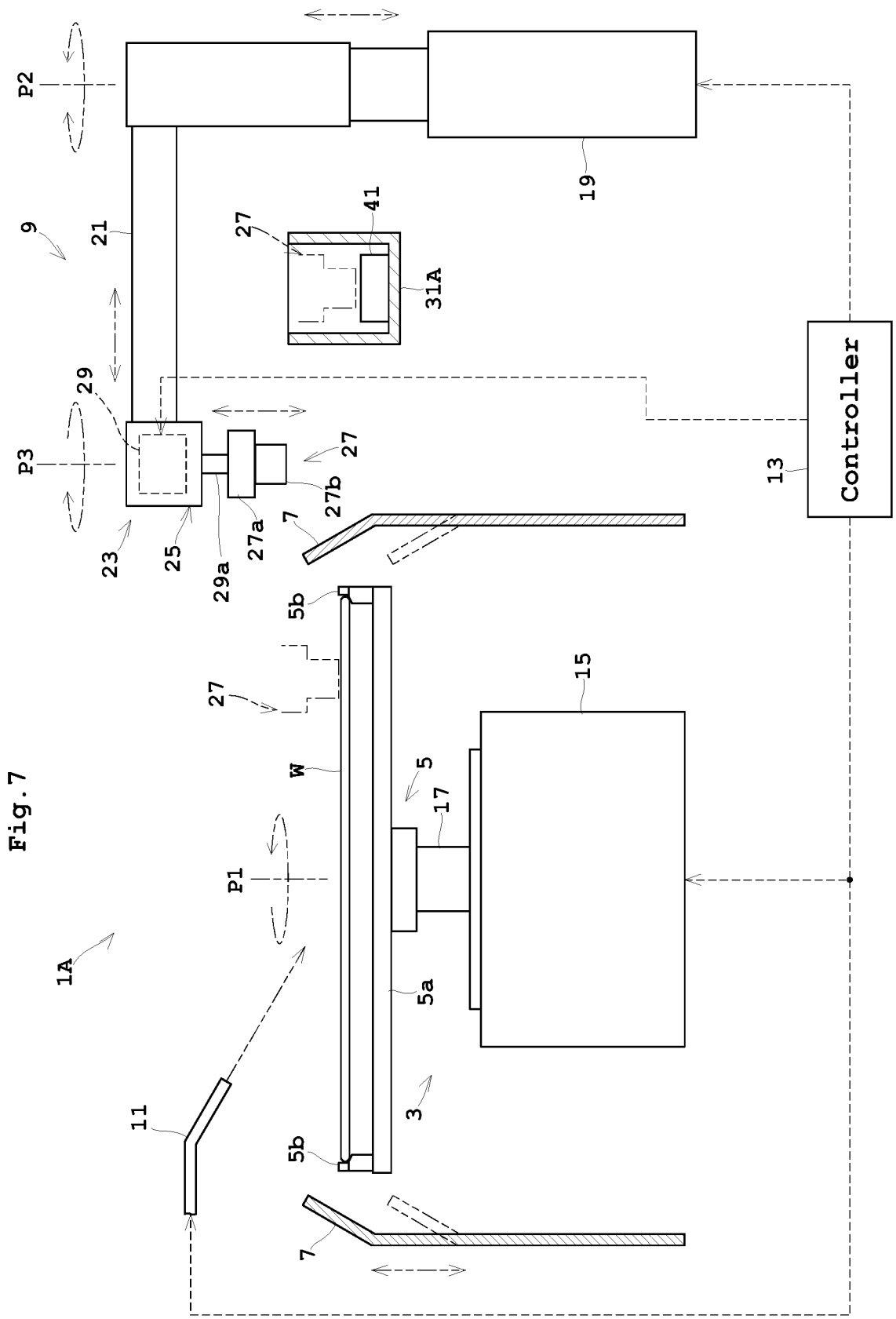
FIG. 7 illustrates an overall configuration of a substrate treating apparatus according to a second embodiment of the present invention.

The following describes a second embodiment of the present invention with reference to the drawings. FIG. 7 illustrates an overall configuration of a substrate treating apparatus according to the second embodiment of the present invention.

Like numerals are used to identify like components which are the same as that in the first embodiment mentioned above, and the components will not particularly be described.

A substrate treating apparatus 1A in the second embodiment differs from the substrate treating apparatus 1 described above in the first embodiment in configuration of a standby pot 31A.

The standby pot 31A includes a pressed member 41. The pressed member 41 is pressed by a cleaning face of the brush body 27b. The pressed member 41 is pressed by a lower face of the brush body 27b. The pressed member 41 preferably has an upper face larger than the lower face of the brush body 27b. The pressed member 41 is made of a material more rigid than the brush body 27b. The pressed member 41 is formed by an fluororesin, for example.

The controller 13 causes a nozzle, not shown, to spray a cleaning liquid to a brush 27 accommodated in the standby pot 31A. The controller 13 causes the brush 27 to press against the pressed member 41 prior to start of performing cleaning treatment to the substrate W. At this time, dust caught into or adhered to the brush 27 when the last substrate W is cleaned is discharged to some extent, and is cleaned off with the cleaning liquid. However, the brush 27 cannot be cleaned completely. Here, it is preferred that the controller 13 causes the brush 27 to press against the pressed member 41 at pressure higher than treatment pressure.

Since the brush body 27b presses against the pressed member 41 at pressure equal to treatment pressure when the cleaning treatment is performed, an amount of deforming the brush body 27b can be equal to an amount of deforming the brush body 27b when the substrate W is treated. Accordingly, dust released when the brush body 27b contacts against the substrate W to apply pressure can be released in advance. Moreover, the brush body 27b presses against the pressed member 41 at pressure higher than the treatment pressure when the cleaning treatment is performed, achieving large deformation of the brush body 27b. Consequently, time until the brush body 27b returns to its original shape can be made long. Therefore, it is possible to certainly make the deformed brush body 27b not to return to its original shape at the time when the brush body 27b contacts against the substrate W. This results in certain suppression of release of dust from the brush body 27b when the brush body 27b contacts the substrate W.

It should be noted that a time from when the brush body 27b is pressed against the pressed member 41 to be deformed to when the deformed brush body 27b returns to its original shape is approximately five seconds, for example. Moreover, a time needed when the brush 27 is moved from the standby pot 31A to a cleaning start position on the substrate W is approximately three seconds, for example. Accordingly, the brush body 27b can contact against the substrate W before the deformed brush body 27b returns to its original shape. Here, such time differs depending on a material of the brush body 27b and a pressing force that the pressed member 41 receives.

The controller 13 causes the brush 27 to move in a manner similar to that in the conventional example, for example. That is, the controller 13 causes the brush 27 to contact at the cleaning start position corresponding to the shaft axis P1 on the substrate W, and to move horizontally to the outer periphery edge of the substrate W while the treatment pressure is applied. Then, the controller 13 causes the brush 27 to move upward to the above of the shaft axis P1, and thereafter, to contact at the position corresponding to the shaft axis P1 on the substrate W again, and then to move horizontally to the outer periphery edge while the treatment pressure is applied.

On the other hand, the controller 13 causes the brush body 27b to press its lower face against the pressed member 41 to deform the lower face before contacting at the cleaning start position on the substrate W (FIG. 8A). A length of the brush body 27b in the vertical direction before deformation is L0 at an initial state. A length of the deformed brush body 27b in the vertical direction is L10. The length L10 is smaller than the length L0.

The controller 13 causes the brush body 27b to move to the cleaning start position on the substrate W before the length of the deformed brush body 27b returns to the length L0 at the initial state before deformation due to its elastic force. Here, the cleaning start position is a position corresponding to the shaft axis P1 on the substrate W, for example. At this time, a length of the brush body 27b in the vertical direction is L11 under a state where the brush body 27b is at a condition immediately before the first-time scanning of contacting the substrate W. The length L11 is smaller than the length L0 and larger than the length L10.

When the first-time scanning is performed, the controller 13 operates a brush head 23 to apply treatment pressure to the brush 27. Accordingly, the length of the brush body 27b in the vertical direction at the first-time scanning is L12 that is smaller than the length L11. The controller 13 causes the brush 27 to move to the outer periphery edge of the substrate W while applying treatment pressure.

When the first-time scanning is finished, the controller 13 causes the brush 27 to move upward and to the above of the shaft axis P1 of the substrate W. Then, the controller 13 operates to perform the second-time scanning. Under a state immediately before the second-time scanning, a length of the brush body 27b in the vertical direction is L11. The length L11 varies in accordance with re-contact time from when the brush body 27b moves upward from the outer periphery edge of the substrate W until when the brush body 27b is brought into contact again at the cleaning start position. A length of the brush body 27b in the vertical direction becomes larger as the re-contact time becomes longer. Accordingly, the controller 13 causes the brush 27 to move within a time when the length of the brush body 27b in the vertical direction does not reach its original length L0. Under the second-time scanning, the length of the brush body 27b in the vertical direction is L12, for example.

As described above, the controller 13 causes the brush body 27b to contact at the cleaning start position of the substrate W before the length of the brush body 27b returns to its initial state. Consequently, release of dust caused by deformation of the brush body 27b can be suppressed. This results in prevention of contamination of the substrate W caused by the deformation of the brush 27.

<8A. Cleaning Treatment>

The following describes the cleaning treatment with reference to FIG. 9. FIGS. 9A to 9R are each an explanatory view of cleaning treatment in the second embodiment. Here in the cleaning treatment, the nozzle 11 supplies treatment liquid, which illustration is omitted.

The controller 13 causes the substrate W to rotate at a number of treatment rotations while the brush 27 is accommodated in the standby pot 31A. This step corresponds to the "rotating step" in the present invention.

Figure 9A:
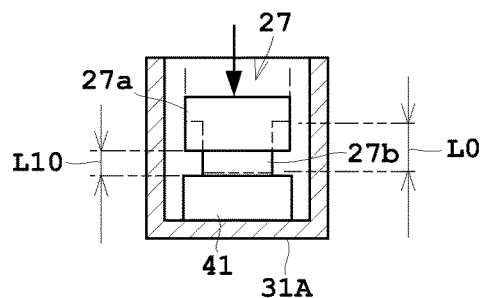
FIGS. 9A to 9E are each an explanatory view of cleaning treatment in the second embodiment.

The controller 13 causes the brush 27, accommodated in the standby pot 31A, to press against the pressed member 41 with the brush head 23 at a standby position (FIG. 9A). This results in reduction of the length L0 of the brush body 27b in the initial state to the length L10. This step corresponds to the "deforming step" in the present invention.

Figure 9B:
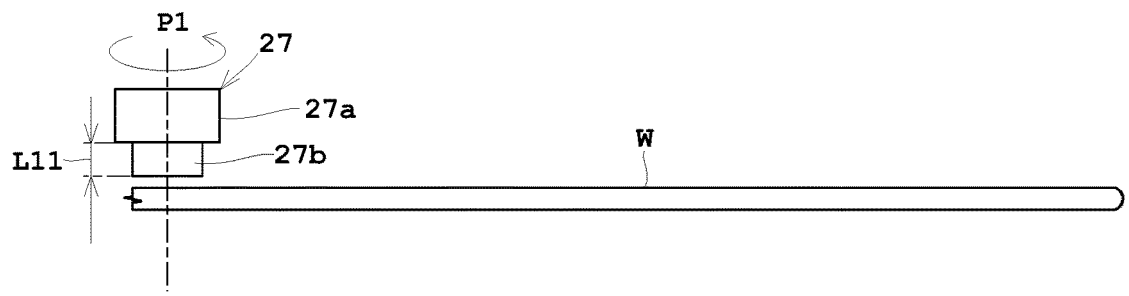
Figure 9C:
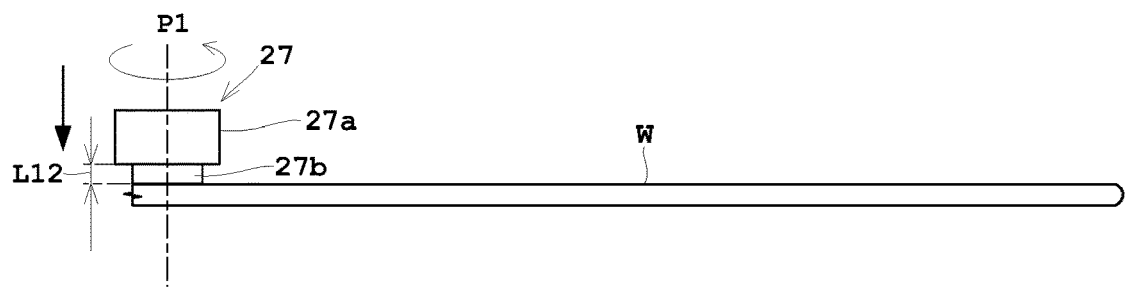

The controller 13 causes the brush body 27b to move above the cleaning start position on the substrate W before the deformed brush body 27b returns to its original shape (FIG. 9B). Then, the controller 13 causes the brush body 27b to contact at the cleaning start position. Specifically, the controller 13 causes the brush body 27b to contact the shaft axis P1 of the substrate W. The length of the brush body 27b in the vertical direction at this time is L12, which is obtained under the treatment pressure (FIG. 9C). This step corresponds to the "deformed brush contacting step" in the present invention.

Figure 9D:
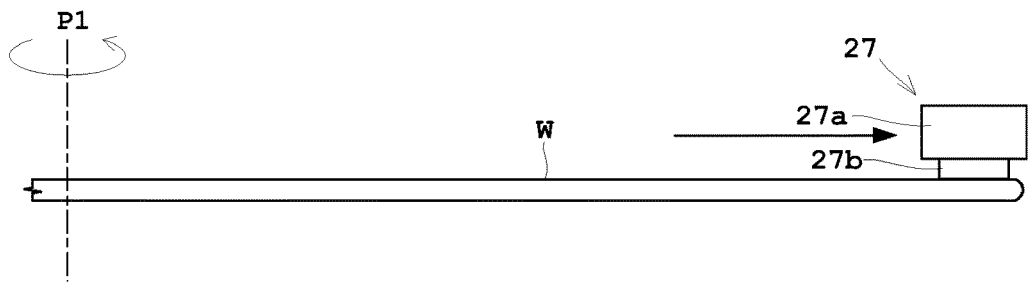

The controller 13 causes the brush 27 to move in the horizontal direction. Specifically, the controller 13 causes the brush 27 to move to the outer periphery edge of the substrate W (FIG. 9D). This step corresponds to the "cleaning step" in the present invention.

Figure 9E:
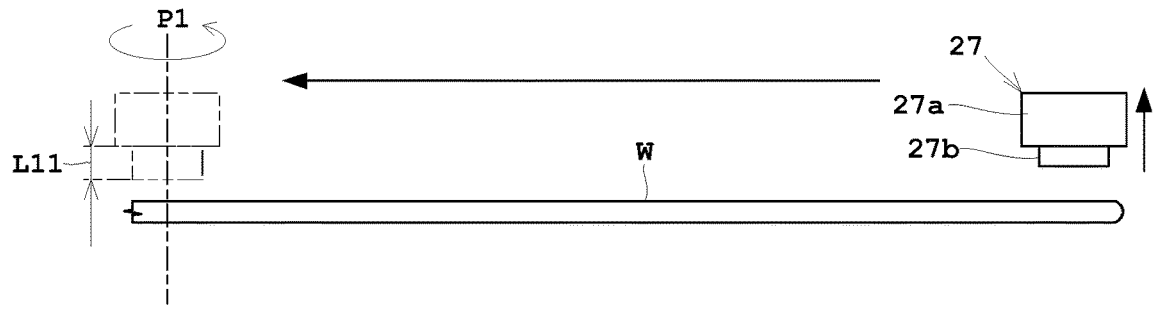

The controller 13 causes the brush 27 to move upward and to the shaft axis P1 of the substrate W. (FIG. 9E.) Then, the controller 13 moves the brush 27 from a side adjacent to the shaft axis P1 toward the outer periphery edge of the substrate W again to clean the upper surface of the substrate W.

According to the second embodiment, the controller 13 causes the brush body 27b to press against the pressed member 41 before contacting against the substrate W, thereby deforming the brush body 27b. Then, the controller 13 operates the rotating and lifting mechanism 19 such that the brush body 27b cleans the substrate W by moving the brush body 27b to the cleaning start position of the substrate W until the brush body 27b returns to its original shape. Consequently, an amount of deformation of the brush body 27b at contact is reduced. Therefore, even if there is dust that is not released from the brush body 27b by pressing of the brush body 27b against the pressed member 41, dust released from the brush body 27b is suppressed at the cleaning start position on the substrate W. Thereafter, the substrate W is cleaned by moving the brush body 27b over the substrate W. This results in prevention of contamination of the substrate W caused by the deformation of the brush body 27b.

Moreover, in the second embodiment, movement of the brush 27 on the substrate W can be controlled in the same manner as in the conventional example. Consequently, changing a control program of the controller 13 can be minimized.

The present invention is not limited to the foregoing examples, but may be modified as follows.

(1) In the first embodiment described above, the outer periphery edge at the outermost periphery of the substrate W has been described as one example for a first position of contacting the brush 27. However, the present invention is not limited to such a position. That is, the position is not limited to the outer periphery edge at the outermost periphery as long as a peripheral velocity is higher than that at the shaft axis P1. For example, the brush 27 may be brought into contact at a position slightly closer to the shaft axis P1 than to the outer periphery edge at the outermost periphery or an intermediate position between the outermost periphery and the shaft axis P1. In such a case as above, the brush 27 may be caused to move horizontally from the position to the shaft axis P1 of the substrate W, and then to move horizontally from the shaft axis P1 to the outermost periphery edge.

(2) In the first and second embodiments described above, treatment to the substrate W in a circular shape in plan view has been described as one example. However, the present invention is not limited to the substrate W in such a shape. For example, the present invention is also applicable to treatment of a substrate W in a rectangular shape.

(3) In the first and second embodiments described above, the chuck (also called mechanical chuck) in which the chuck unit 5 contacts and supports the outer periphery edge of the substrate W has been described as one example. However, the present invention is not limited to this configuration. For example, the present invention is also applicable to a chuck (suction chuck) for sucking a lower surface of the substrate W to hold the substrate W.

(4) In the second embodiment described above, the brush 27 presses against the pressed member 41 at pressure higher than the treatment pressure. However, such an embodiment is not limited in the present invention. That is, as long as the brush 27 is deformed, there is no need that the pressure at which the brush 27 presses the pressed member 41 is higher than the treatment pressure.

(5) In the second embodiment described above, such a configuration has been described as an example that the pressed member 41 is provided on the standby pot 31A. However, the present invention is not limited to this construction. For example, the pressed member 41 may be arranged between the standby pot 31A and the guard 7. Moreover, the pressed member 41 may be the substrate W. That is, a portion adjacent to the outer periphery edge of the substrate W is used for the pressed member 41. The brush body 27b is deformed by being pressed against the portion adjacent to the outer periphery edge of the substrate W. Then, the brush body 27b is lifted upward. Before the brush body 27b returns back to its shape, the brush body 27b is moved to contact the shaft axis P1 of the substrate W as the cleaning start position, and is moved toward the outer periphery edge of the substrate W. In this case, there is no need to provide the pressed member 41 separately, achieving suppressed cost. Moreover, the second embodiment is applicable to the currently-used apparatus easily only by changing a program that controls movement of the brush 27.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for performing cleaning treatment to a substrate by contacting a brush against the substrate, the method comprising:
   a rotating step of rotating a spin holder, holding the substrate, around a vertical shaft axis;
   a deforming step of deforming the brush by pressing a cleaning face of the brush against a pressed member before the brush contacts the substrate;
   a deformed brush contacting step of contacting the brush against the substrate at a cleaning start position of the substrate before the brush returns to its original undeformed shape while the substrate is rotated in a horizontal plane; and
   a cleaning step of cleaning the substrate by moving the brush over the substrate,
   wherein the steps are performed in this order.

2. The substrate treating method according to claim 1, wherein,
   in the deforming step, the brush presses against the pressed member at a pressure higher than a treatment pressure at which the brush presses against the substrate in the cleaning step.

3. The substrate treating method according to claim 1, further comprising
- an outer periphery edge contacting step of contacting the brush against the substrate at an outer periphery edge contacting position closer to an outer periphery edge of the substrate than to the shaft axis while the substrate is rotated in a horizontal plane;
- a first moving step of moving the brush from the outer periphery edge contacting position to a side adjacent to the shaft axis while the brush is brought into contact against the substrate; and
- a second moving step of moving the brush from the side adjacent to the shaft axis toward the outer periphery edge after the first moving step.

4. The substrate treating method according to claim 3, wherein
the first moving step and the second moving step are performed a plurality of times.

5. The substrate treating method according to claim 4, wherein
the outer periphery edge contacting position is located at the outer periphery edge of the substrate.

6. The substrate treating method according to claim 3, wherein
the outer periphery edge contacting position is located at the outer periphery edge of the substrate.

* * * * *